(12) United States Patent
Kim et al.

(10) Patent No.: US 11,081,828 B2
(45) Date of Patent: Aug. 3, 2021

(54) POWER MODULE HOUSING

(71) Applicant: SEMICONDUCTOR COMPONENTS INDUSTRIES, LLC, Phoenix, AZ (US)

(72) Inventors: Jihwan Kim, Seoul (KR); Yushuang Yao, Shenzhen (CN); Bosung Won, Seoul (KR); Atapol Prajuckamol, Thanyaburi (TH); Olaf Zschieschang, Vaterstetten (DE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/510,385

(22) Filed: Jul. 12, 2019

(65) Prior Publication Data

US 2020/0358221 A1 Nov. 12, 2020

Related U.S. Application Data

(60) Provisional application No. 62/846,209, filed on May 10, 2019.

(51) Int. Cl.
*H01R 12/00* (2006.01)
*H01R 13/504* (2006.01)
*H05K 7/14* (2006.01)
*H01R 13/621* (2006.01)

(52) U.S. Cl.
CPC ..... *H01R 13/5045* (2013.01); *H01R 13/6215* (2013.01); *H05K 7/1404* (2013.01)

(58) Field of Classification Search
CPC ............ H01R 13/5045; H01R 13/6215; H05K 7/1404

USPC .................................. 439/76.1, 76.2, 607.1
See application file for complete search history.

(56) References Cited

U.S. PATENT DOCUMENTS

| 4,723,919 A | 2/1988 | Crane |
| 6,024,584 A | 2/2000 | Lemke et al. |
| 6,093,035 A | 7/2000 | Lemke et al. |
| 6,325,644 B1 | 12/2001 | Lemke et al. |
| D550,628 S | 9/2007 | Whiteman, Jr. et al. |

(Continued)

FOREIGN PATENT DOCUMENTS

| EP | 2940718 B1 | 4/2018 |
| WO | 2018159230 A1 | 9/2018 |

OTHER PUBLICATIONS

"Assembly Instructions for the Easy-Pressfit Modules", infineon; AN2009-01; Revision 2/4, Jun. 17, 2019, 31 pages.

(Continued)

*Primary Examiner* — Khiem M Nguyen
(74) *Attorney, Agent, or Firm* — Brake Hughes Bellermann LLP

(57) ABSTRACT

A housing that can be used for a power module in a power system is disclosed. The housing includes features to improve the insulating properties and to reduce or eliminate a mechanical stress on a housing that could crack or break a substrate contained within the housing. The insulating properties are improved by protrusions that surround apertures for press-fit pins. Each protrusion can increase a creepage for the housing by extending the surface of the housing along a press-fit pin. The mechanical stress is reduced by a mounting flange that includes a wedge surface and a flexible structure that react to a force applied when the mounting flange is fastened to a surface by a fastener.

23 Claims, 10 Drawing Sheets

(56) References Cited

U.S. PATENT DOCUMENTS

| | | |
|---|---|---|
| 7,950,962 B2 | 5/2011 | Mase et al. |
| D741,813 S | 10/2015 | Leung |
| D745,852 S | 12/2015 | Harper, Jr. et al. |
| D768,086 S | 10/2016 | Leung |
| D770,984 S | 11/2016 | Leung |
| 10,396,481 B2 | 8/2019 | Lauermann |
| D887,366 S | 6/2020 | Madathil Sankarankutty Nair et al. |

OTHER PUBLICATIONS

Vincotech, "Vincotech Adds flor E1/E2 Product Family," Aug. 2018 Product News, Oct. 21, 2018.
Vincotech, "10-Ex12PMA0335C-L188A48x_FD," datasheet, rev. 2, May 11, 2018.

A - A'

POWER MODULE HOUSING

FIELD OF THE DISCLOSURE

The present disclosure relates to power electronics and more specifically, to a housing for a power module.

BACKGROUND

A power integrated module (i.e., power module) can include a variety of components (e.g., power transistors, diodes, etc.) that are mechanically and electrically coupled (e.g., as dies) to a direct bonded copper (DBC) substrate. The DBC substrate is a multilayer structure that includes a ceramic (e.g., $Al_2O_3$, AlN, BeO) substrate layer, a top copper layer, and a bottom copper layer. The top copper layer can define patterns (i.e., traces) that can provide interconnections between the components in order to form a circuit. Additionally, pins (e.g., solder-pins or press-fit-pins) may be mechanically and electrically coupled to the traces to serve as connection points to the circuit.

A power module housing (i.e., housing) contains the circuit and provides clearance for the pins. For example, the DBC substrate (i.e., with its components) may be disposed (e.g., affixed) within a cavity defined by the housing. In the affixed position, the pins of the DBC substrate may extend through (and past) apertures (i.e., pin holes) in a first (i.e., top) surface of the housing. The housing may also include a large opening in a second (i.e., bottom) surface of the housing, and the bottom copper layer of the DBC substrate may extend through (and past) the opening in the bottom surface.

In a power system, the power module can be assembled with a printed circuit board (PCB) by mechanically and electrically coupling the pins to vias (i.e., plated through holes, through holes) in the PCB. Additionally, the power module can be assembled with a heat sink by mechanically fastening the housing to the heat sink so that the bottom copper layer is pressed into contact with a surface of the heat sink.

New power module housings are needed to provide precise and repeatable assembly, to insulate high voltages, and to reduce mechanical stress on the housing and the DBC substrate.

SUMMARY

Accordingly, in one general aspect, the present disclosure describes a power module housing. The power module housing includes a top surface that has a plurality of apertures. Each aperture is within a raised area above the top surface and is configured to receive a press-fit pin. The power module housing also includes a (first) side surface and a (first) flange. The flange is contiguous to the side surface. The flange has (i) a (first) opening to receive a (first) fastener, (ii) a (first) wedge surface, and (iii) a (first) flexible structure that includes a plurality of collinear slots. The wedge surface and the flexible structure reduce a stress on the power module housing when the fastener is used to mount the power module housing to a surface.

In a possible implementation, the power module housing further includes a second side surface and a second flange. The second flange is contiguous to the second side surface. The second flange has (i) a first opening to receive a second fastener, (ii) a second wedge surface, and (iii) a second flexible structure that includes a plurality of collinear slots. The second wedge surface and the second flexible structure reduce a stress on the power module housing when the second fastener is used to mount the power module housing to the surface.

In another aspect, the present disclosure describes a power module. The power module includes a housing that has a plurality of apertures in a top surface and a pair of mounding flanges at opposite sides. Each mounting flange includes a wedge surface and a flexible structure. The power module further includes a plurality of press-fit pins that extend through the plurality of apertures and that are mechanically and electrically configured to couple to a plurality of vias in a printed circuit board (PCB). Each aperture corresponds to a protrusion that extends above the top surface of the housing. The power module further includes fasteners configured to couple the pair of mounting flanges to a heat sink. The wedge surface and the flexible structure of each mounting flange reduces the stress on the housing caused by the coupling.

In another aspect, the present disclosure describes a housing. The housing includes a plurality of cross-shaped apertures through a top surface. Each cross-shaped aperture is configured to receive a press-fit pin having a rectangular cross-section that is oriented in one of two possible directions. Each aperture is centered within a protrusion that extends a height about the top surface. The housing also includes a pair of mounting flanges at opposite sides of the housing. Each mounting flange has a wedge surface and a flexible structure. The wedge surface and the flexible structure of each mounting flange are configured to reduce a stress exerted on the mounting flange.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A housing that can be used for a power module in a power system is disclosed. The housing includes features to improve press fit assembly, to increase insulating properties, and to reduce mechanical stress on the housing and on a circuit within.

Figure 1:
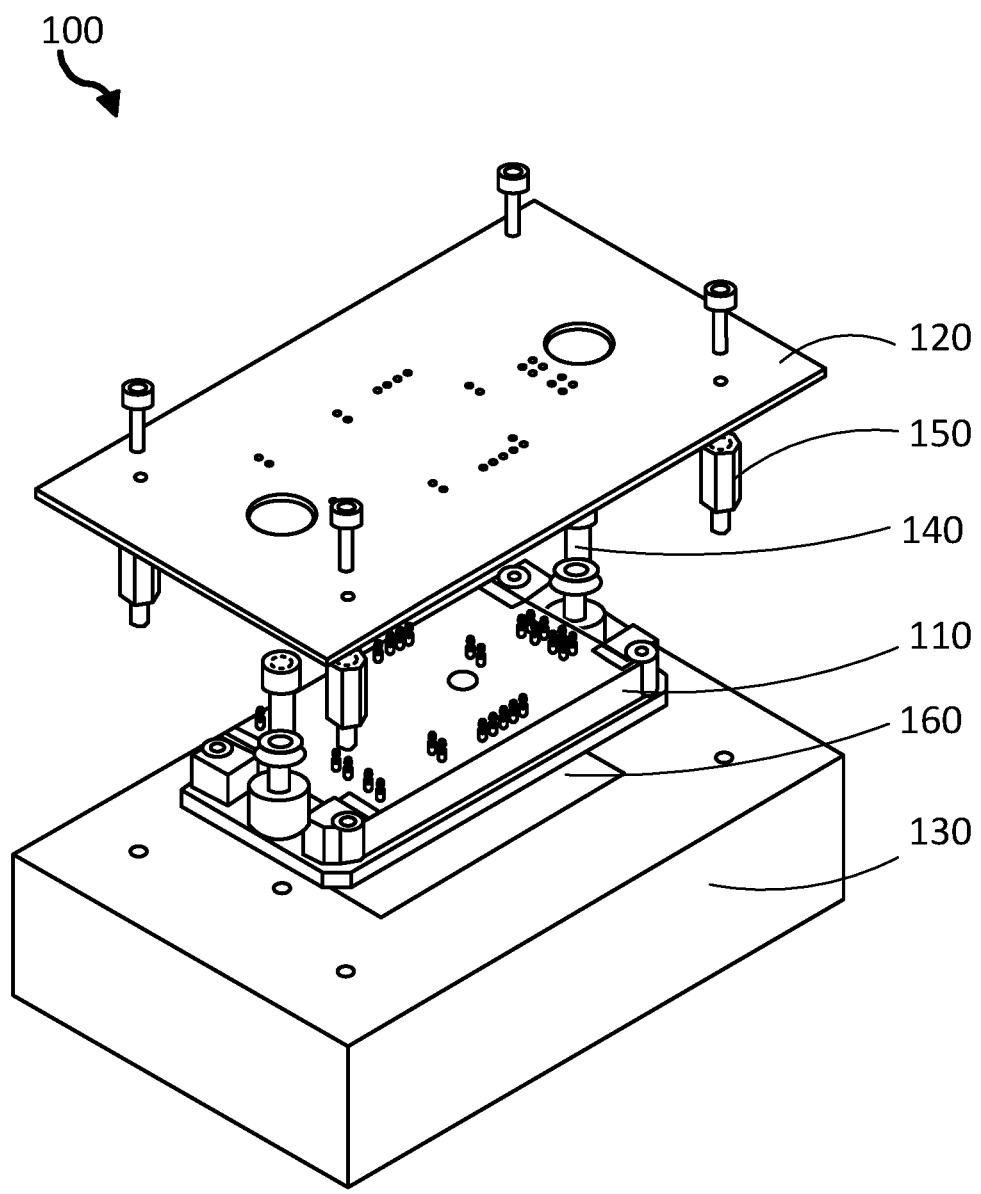
FIG. 1 is a perspective, exploded view of a power system according to an implementation of the present disclosure.

FIG. 1 is a perspective, exploded view of a power system 100 according to an implementation of the present disclosure. The power system 100 includes a power module 110 that can be electrically coupled to a printed circuit board (PCB) 120 by press fitting a plurality of press-fit pins on a top surface of the power module 110 into spatially corresponding pin holes (i.e., vias, through holes) in the PCB. The power module may dissipate a large amount of power as heat. This heat may be removed by a heatsink 130. A top surface of the heat sink is in direct contact (or in contact via a thermal medium 160) with a bottom surface of the power module. The power module may include features (e.g., a left (first) flange and a right (second) flange) so that a fastener 140 (or fasteners) may mechanically couple (i.e., bolt) the power module to fastener (e.g., tapped) holes in the top surface of the heat sink. The top surface of the heat sink may also include fastener holes (e.g., tapped holes) for receiving standoff posts 150 that may serve as mounting points for the PCB.

The operation of the power system 100 can be affected by misalignments in the stack formed by the heat sink 130, the power module 110, and the PCB 120. For example, if the bottom surface of the power module is not flush with the top surface of the heat sink then cooling diminished and the power module could overheat. In another example, if the PCB is tilted (i.e., not flush) with respect to the power module, the press-fit pins may be bent or broken during assignment. The misalignments may also exert mechanical stress (i.e., stress) on the circuitry within the power module, which could lead to defects (e.g., cracks or breakage) that negatively affect the operation of the circuitry.

Figure 2:
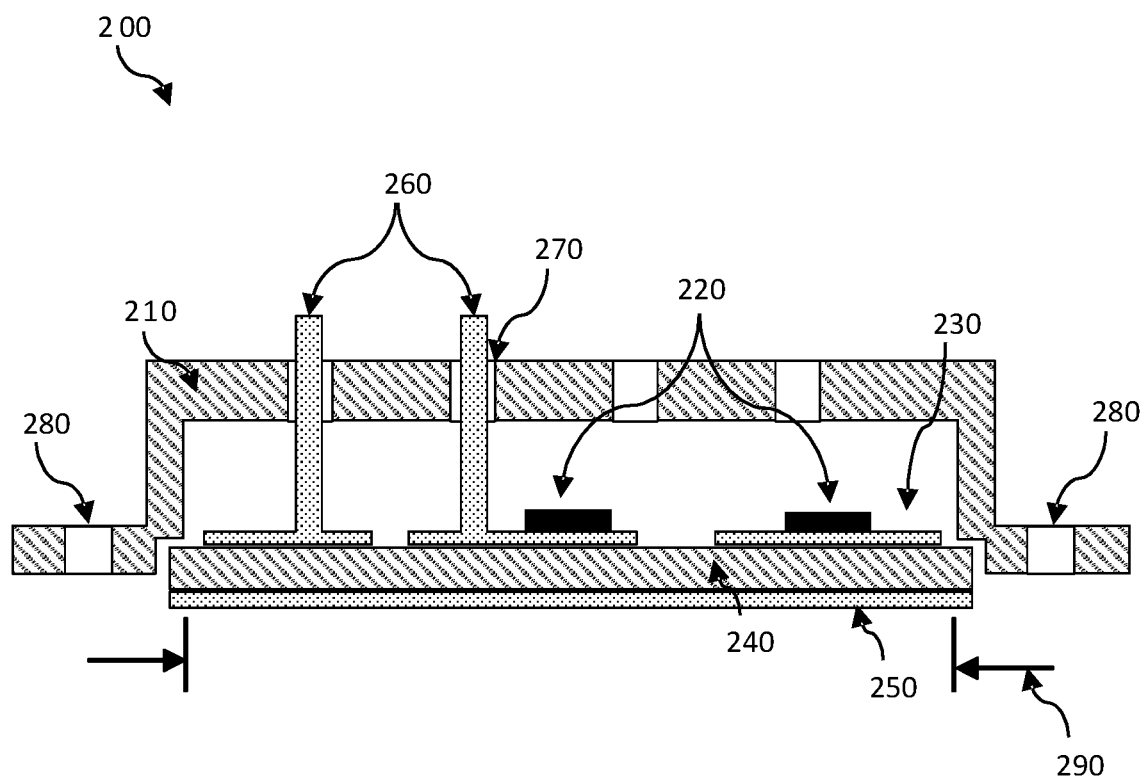
FIG. 2 is a side cross-section view of a power module according to an implementation of the present disclosure.

FIG. 2 illustrates a cross section side view of a power module 200. The power module 200 includes a power module housing (i.e., housing) 210 that positions and supports circuitry. The circuitry can include devices 220 (e.g., wafer level electronic devices) coupled to a top conductor (e.g., copper) layer 230 on a top surface of a substrate 240 (e.g., direct bonded copper substrate), The bottom surface of the substrate may be covered by a bottom conductor layer 250 that can be used to transfer heat from the devices and/or the substrate to a heat sink (not shown). The top conductor layer 230 can be etched to form traces that interconnect the devices 220 and other circuit components.

The other circuit components may include a plurality of press-fit pins 260 that may provide electrical connection points to the circuitry (i.e., circuit). The press-fit pins 260 are mechanically and electrically coupled to the top conductor layer (i.e. top conductor) 230 of the substrate 240. Each press-fit pin is oriented and aligned to extend through an aperture 270 in the top surface of the housing 210 when the circuit is positioned and held (e.g., bonded) within an interior defined by the housing. The top surface of the housing 210 may include an aperture 270 for each press-fit pin (i.e., as shown in FIG. 2) or may include a plurality of apertures (i.e., some with press-fit pins and some without) to accommodate variations in the circuitry.

The housing 210 also includes at least one mounting flange portion (i.e., mounting flange, flange), each having one or more fastener holes (i.e., holes) 280 to allow the housing 210 to be fastened to a heat sink (not shown). The bottom surface of the housing includes a (large) aperture 290 to expose at least a portion of the bottom conductor layer (i.e., bottom conductor) 250 to the heat sink when the housing 210 is fastened (i.e., clamped) to the heat sink. For example, screws, through holes 280 in the one or more flanges, may bolt the housing 210 to tapped holes in a top surface of the heat sink and press the bottom conductor 250 to the heat sink to form a thermal path. In some cases, heat conducting material (e.g., thermal paste) may be included between the bottom conductor 250 and the heat sink.

The substrate 240 for the power module circuit can be a ceramic (e.g., $Al_2O_3$) that is well suited for the high voltages and the temperatures associated with power electronics but may be more susceptible to cracking and/or breaking under a mechanical stress (i.e., stress) than other substrate types. The ceramic substrate 240 may experience mechanical stress from a variety of sources. For example, the ceramic substrate may experience a mechanical stress resulting from a lateral (i.e., bending) torque exerted on one or more press-fit pins 260 as they are pressed into holes in a PCB. The ceramic substrate 240 may also experience a mechanical stress resulting from a cantilever torque exerted on a flange as it is clamped (i.e., bolted) to the heatsink.

Figure 3:
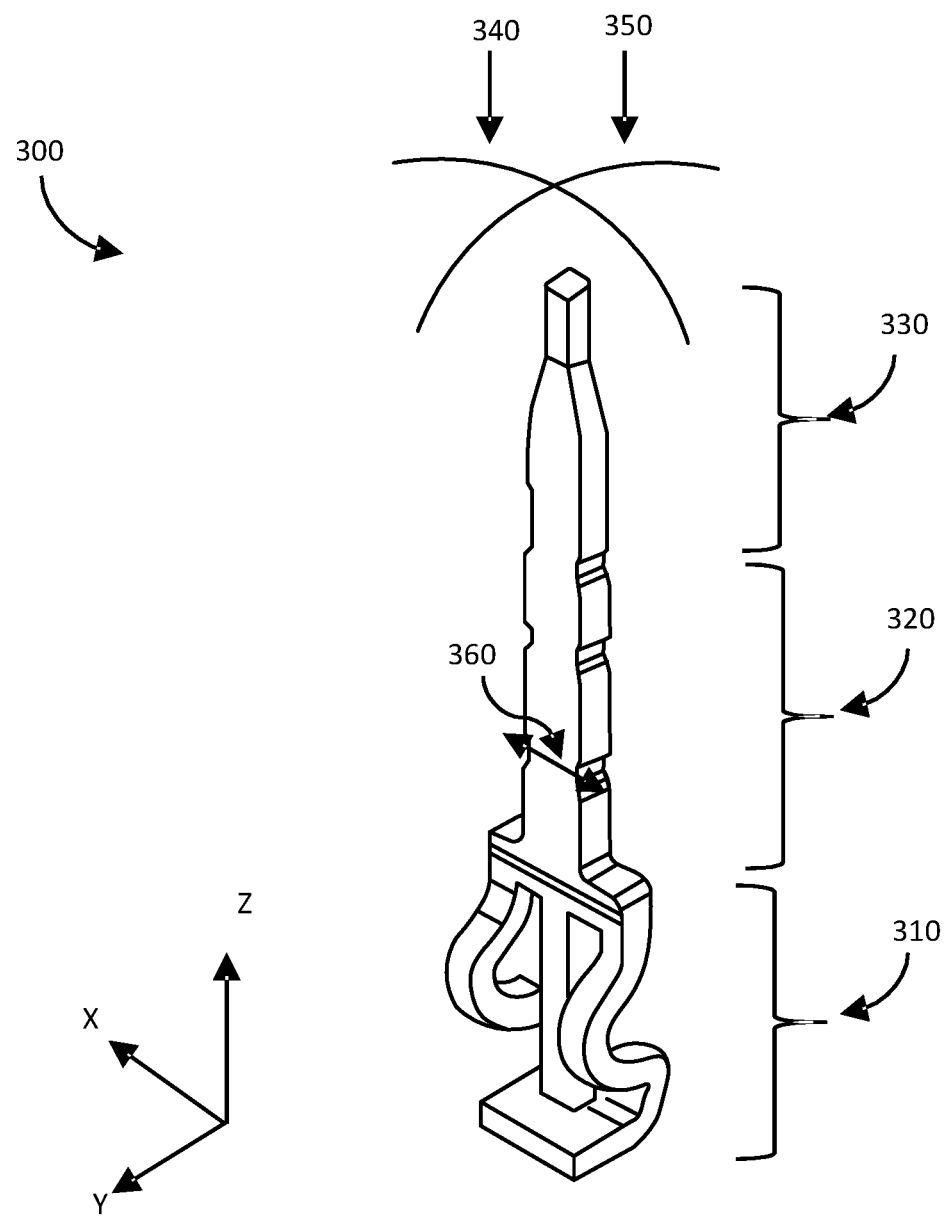
FIG. 3 is a perspective view of a press-fit pin according to a possible implementation of the present disclosure.

An example of a press-fit pin is shown in FIG. 3. The press-fit pin 300 has a bottom portion 310, a middle portion 320, and a top portion 330. The top portion 330 of the press-fit pin defines an elliptic leaf spring that forms a compression fit with a PCB via upon insertion. The middle portion 320, which fits, through the apertures in the housing, has a rectangular cross-section. The bottom portion 310 includes a bottom surface disposed (e.g., soldered, conductively bonded, etc.) on the top conductor surface. The bottom portion 310 can also include features to provide flexibility to the press-fit pin. When view from above (i.e., negative z-direction), the press-fit pin has an asymmetric cross-section. The response of the press-fit pin to lateral torque in a first direction 340 may be different from the response to a lateral torque in a second direction 350. For example, it may be easier to bend a pin in one plane (e.g., y-z plane) than another (e.g., x-z plane). Accordingly, the plurality of press-fit pins in the power module may have different orientations so that the plurality of press fit pins does not easily bend in any particular direction. For example, the plurality of pins may include a first portion (e.g., a first half of the plurality) that have an first orientation defined by a long dimension 360 aligned with a first direction (e.g. the x-direction—as shown in FIG. 3) and a second portion (e.g., a second half of the plurality) that have a second orientation defined by the long dimension aligned with a second direction (e.g., the y-direction) at an angle with the first direction. For example, the first direction and the second direction may be orthogonal.

The housing can have a plurality of apertures to accommodate the different (e.g., two possible) orientations of the plurality of press-fit pins. In one possible implementation, approximately half (e.g., half) of the plurality of apertures are slots aligned in a first direction and approximately half (e.g., half) of the plurality of apertures are slots aligned in a second direction that is orthogonal to the first direction. In another possible implementation, the plurality apertures are all have the same orientation but have a shape (e.g., cross-shape) that can accommodate press-fit pins in more than one orientation. For example, a vertical portion a cross-shaped aperture may accommodate a press-fit that is aligned in the first direction and a horizontal portion of the cross-shaped aperture can accommodate a press-fit pin that is aligned in the second direction.

Figure 4:
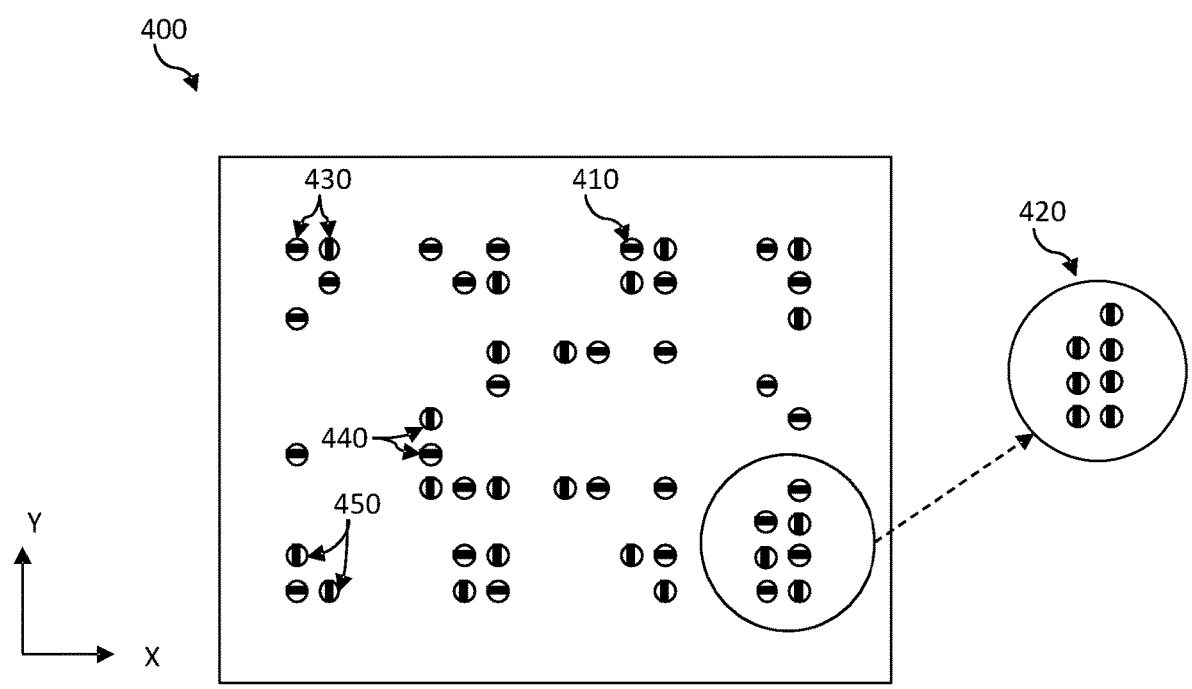
FIG. 4 is a top view of a printed circuit board for a power system that has vias containing press-fit pins according to a possible implementation of the present disclosure.

The number and layout (i.e., position) of press-fit pins may be based on the layout of the circuit and/or the layout of a PCB. FIG. 4 is a top view of an example implementation of a PCB. The PCB 400 has vias 410 (e.g., plated through-holes, though-holes) and the view illustrates press-fit pins (i.e., black rectangles) within each via. The through-holes 410 of the PCB may have a circular cross-section, while the press-fit pins may have a rectangular cross-section. Accordingly, press-fit pins 410 may make contact with only a portion of the interior surface of the through-holes. In FIG. 4, each press-fit pin has two contact points on opposite sides of a corresponding through-hole in the PCB. Due to the nature of the press-fit connection, more mechanical stress is placed on the PCB at the contact points than in other areas. Accordingly, when the contact points of adjacent through-holes are aligned, as shown in the inset figure 420, the stress on the PCB (e.g., between through-holes) may be sufficient to deform the PCB or otherwise influence the integrity of the contact point. Accordingly, the press-fit pins can be oriented variously to reduce stress on the PCB.

As shown in FIG. 4, roughly half of the press-fit pins are oriented in a first direction (X-direction), with the remainder of the press-fit pins oriented in a second direction (Y-direction). The choice of direction may be distributed over a surface so that horizontally adjacent press-fit pins 430 (i.e., adjacent along X-direction) have orthogonal orientations, and so that vertically adjacent press-fit pins 440 (i.e., adjacent along the Y-direction) have orthogonal orientations. This results in diagonally adjacent press-fit pins 450 having the same orientation.

As mentioned, the variation of orientation may mitigate or eliminate pin bending resulting from a press-fit process and the variation of orientation may reduce stress on the PCB. In some implementations, it is not necessary to orient all press-fit pins exclusively to the pattern described above. In some implementations, it may be necessary to align a portion (e.g., one or more) of the press-fit pins differently. For example, circuitry in a local region (e.g., FIG. 4 inset 420) may require that the bottom of the press-fit pins be installed (e.g., soldered) in a particular direction. In another example, aligning the pins in a particular direction within a region may improve the voltage handling capability of the circuit (e.g., by increasing a separation). A power module housing having features to accommodate these variations may be desirable.

Figure 5:
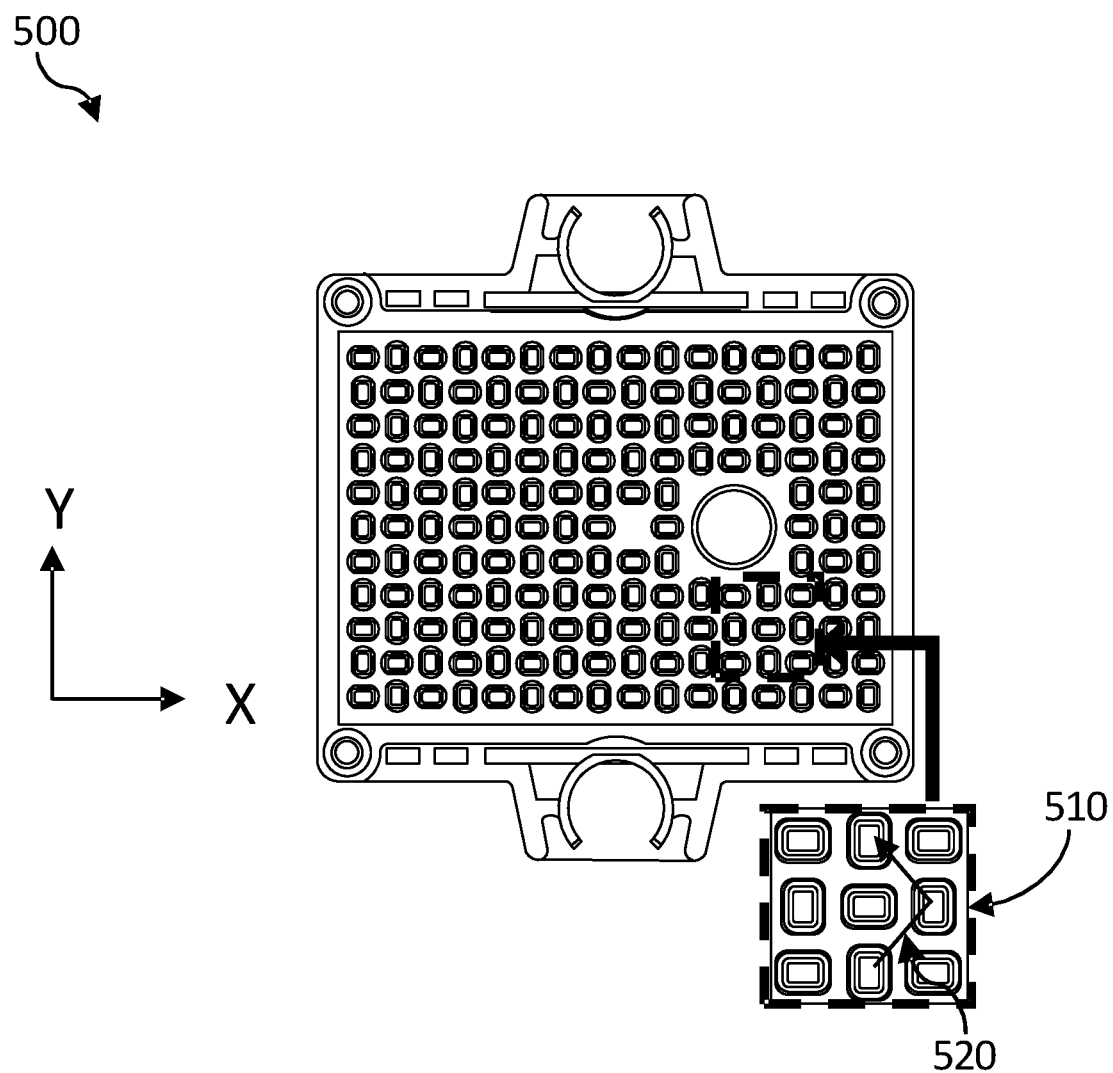
FIG. 5 is a top view of a power module housing with slot-shaped apertures, each configured to receive a press-fit pin in one of two possible orientations.

FIG. 5 is a top view of a possible implementation of a power module housing 500. The top surface includes a plurality of apertures that are each configured to receive a press-fit pin. In the non-limiting implementation shown, the apertures are all rectangular slots (i.e., slots) that each has dimensions that closely (e.g., within 30-60%) match the rectangular cross-section of a press-fit pin. The apertures are oriented in a first direction (X) or a second direction (Y). The first direction and the second direction may be orthogonal but can also have other spatial relationships. For example, the first direction and the second direction form an angle other than 90 degrees. The first direction and the second direction shown in the implementation of FIG. 5 are aligned with sides of the power module housing. In other implementations, these directions may form angles with the sides. Additionally the slot apertures of FIG. 5 are distributed equally between orientations. In some implementations, the distribution of orientations may not be equal.

As shown in the inset 510 of FIG. 5, the arrangement of the aperture orientations can form a zig-zag pattern 520. The zig-zag pattern 520 of rectangular slots allows press-fit pin orientations that may help prevent a module from being mechanically biased during PCB mounting. Additionally, the zig-zag patter of rectangular slots allows mechanical stress caused by contact points between the press-fit pins and the PCB to be distributed (e.g., evenly) over the PCB by preventing adjacent press-fit pins from contacting the PCB in the same orientation.

Figure 6:
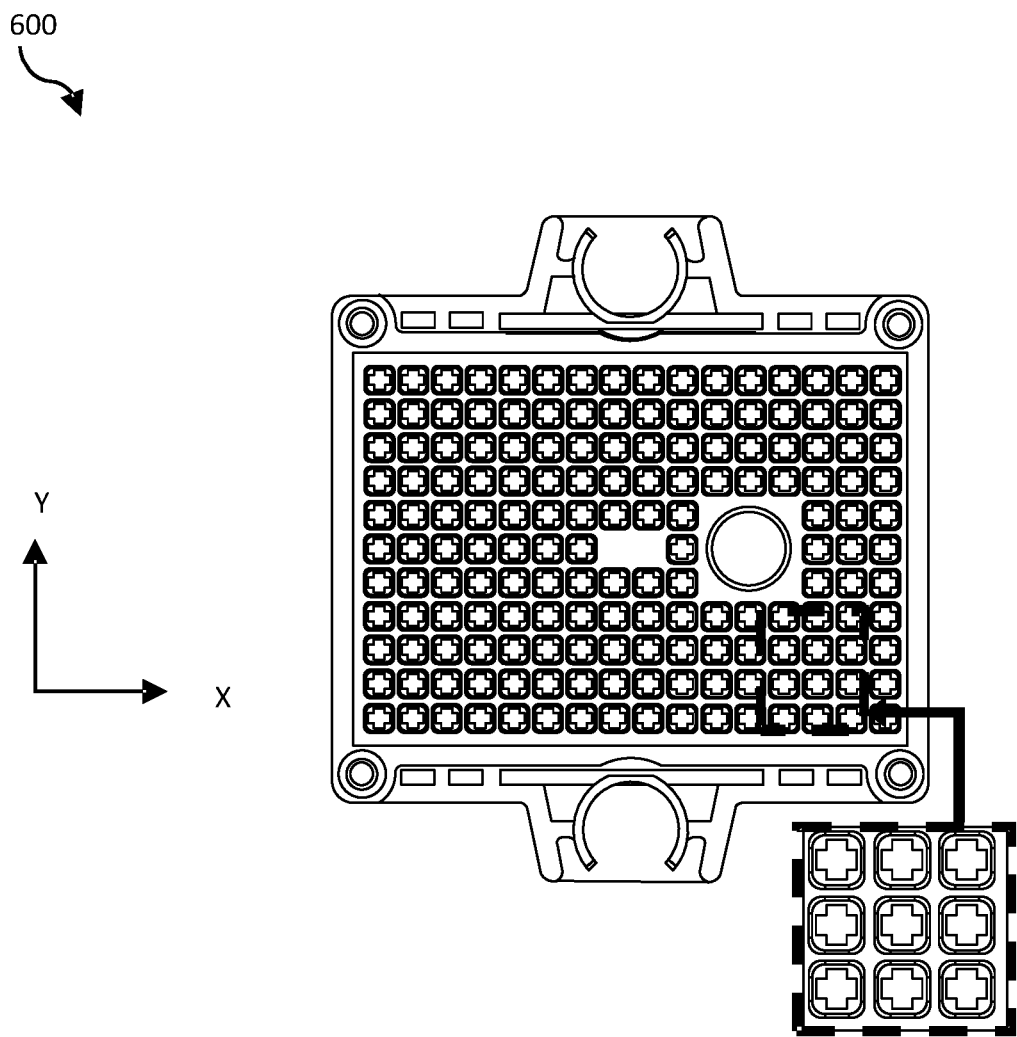
FIG. 6 is a top view of a power module housing with cross-shaped apertures, each configured to receive a press-fit pin in either of two possible orientations.

As mentioned previously, in some implementations it may be desirable to orient a portion or all adjacent press-fit pins in the same direction (i.e., parallel). For example, a larger distance between adjacent press-fits pins may be achieved when they are aligned in the same direction. FIG. 6 is a top view of a possible implementation of a power module housing 600 that can accommodate these implementations. The top surface includes a plurality of apertures that are each configured to receive a press-fit pin. In the non-limiting implementation shown, the apertures are all cross-shaped apertures. Each cross-shaped aperture has dimensions that closely (e.g., within 30-60%) match the rectangular cross-section of a press-fit pin aligned in either a first direction (X-direction) or a second direction (Y-direction). The portions of the cross-shaped aperture are shown aligned with sides of the power-module housing but in some implementations they may form an angle with the sides. As shown in the inset of FIG. 6, the aperture orientations are all identical and aligned.

Figure 7A:
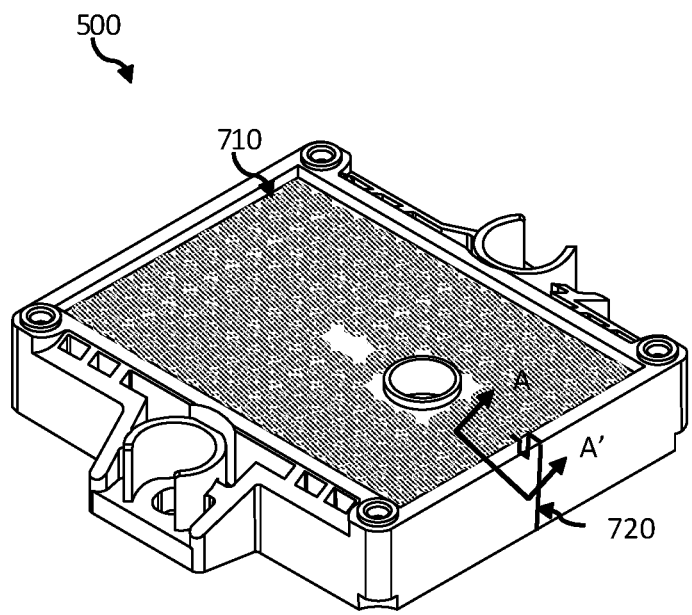
FIG. 7A is a perspective top view of a power module housing with a highlighted creepage length according to an implementation of the present disclosure.

The top surface of the power module housing 500 can have a protrusion 710 (i.e., raised area) corresponding to each aperture. FIG. 7A is a perspective top view of the power module housing of FIG. 5. Each aperture in the top surface includes a protrusion 510 that contains (i.e., surrounds) an aperture and extends above the top surface of the housing by a protrusion height (i.e., height). The protrusions increase a creepage length (i.e., creepage distance, creepage) of the power module housing 500.

The creepage length in a power system is defined as the length along a non-conducting surface between a first conductor and a second conductor, and corresponds to the electrical insulating properties of the surface to high voltages. In other words, creepage length is the length of a leakage path along a surface between a high voltage and a low voltage and is maximized to minimize (or prevent) leakage currents from flowing. The creepage length may be part of a code or specification for safe operation. Accordingly, it may be desirable to maximize a creepage length of a housing using in a power system.

Figure 7B:
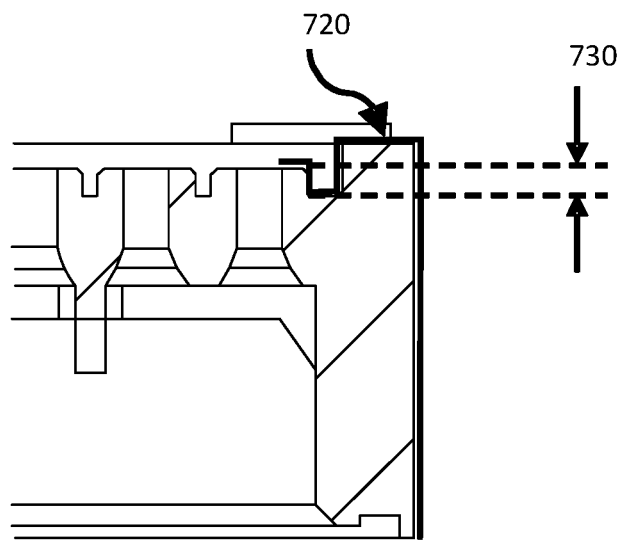
FIG. 7B is a cross-section of the power module housing in the cut plane shown in FIG. 7A.

FIG. 7B is a cross-section view of a portion (i.e., A-A') of the power module housing shown in FIG. 7A. FIG. 7B illustrates effect of the protrusion on a creepage length 720 between a heat sink (e.g., at a ground voltage) and a press-fit pin (e.g., at a high voltage). Compared to a top surface with no protrusions, the creepage length is extended an amount proportional to (e.g., twice) a height 730 of the protrusion (i.e., one height going into a valley formed by the protrusion and one height coming out of the valley formed by the protrusion). Accordingly, the housing of the present disclosure includes raised areas containing (i.e., surrounding) each aperture so that a creepage length that includes the top surface is increased. Accordingly, the housing of the present disclosure may offer higher insulating properties than housings without protrusions.

Figure 8A:
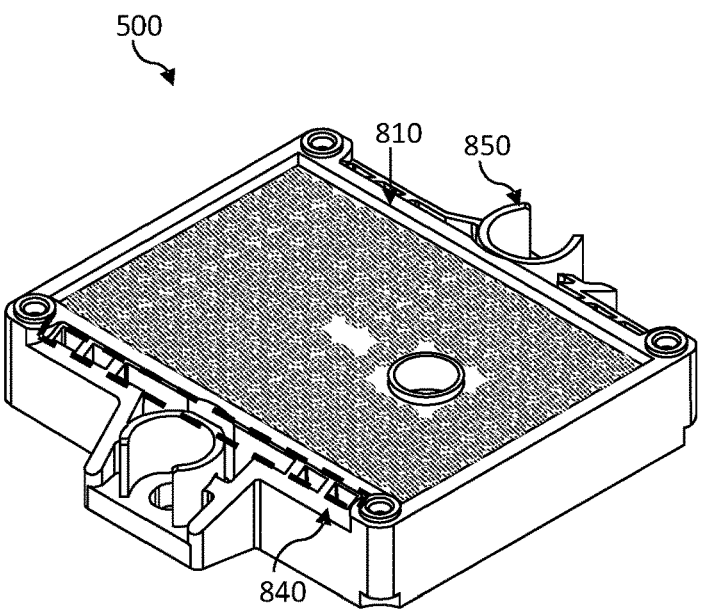
FIG. 8A is a perspective, top view of a power module housing according to an implementation of the present disclosure.

FIG. 8A is a perspective top view of the power module housing 500 of FIG. 5. The power module housing may include dimensions common in power system (i.e., power electronics). For example the top surface may be 56.7 by 62.8 millimeters (mm) and include 165 apertures. Each aperture may by 1.6 by 1.05 mm to accommodate a press-fit pin with cross-sectional dimensions of 1.2 by 0.64 mm. The apertures may be uniformly distributed over the top surface or may define aperture free areas to accommodate additional features. Each aperture has a corresponding raised area (i.e., protrusion). The raised area may be 2.8 by 2.25 mm and may rise (i.e., protrude) to a height of 0.8 mm above the top surface. The supplied dimensions are provided for understanding and are not intended to be limiting.

Figure 8B:
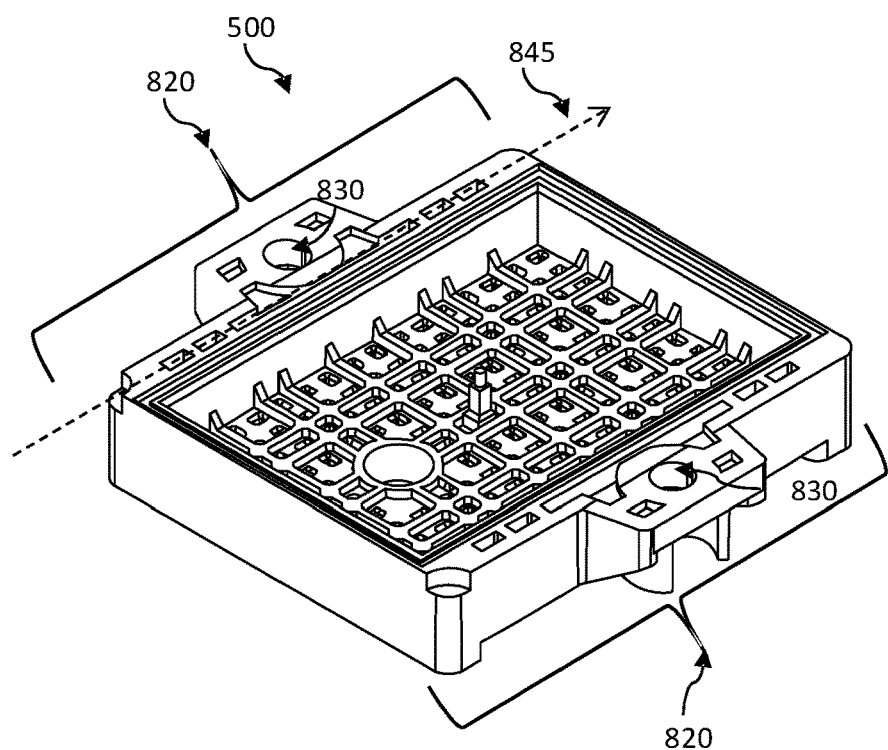
FIG. 8B is a perspective bottom view of the power module housing of FIG. 5A.

FIG. 8B is a perspective bottom view of the power module housing of FIG. 5. In one possible implementation, the top surface and the side surfaces of the module housing define an interior that may be 51.3 by 35.2 mm and are configured to receive the circuit on a substrate (e.g., DBC substrate), which in some implementations is bonded to the power module housing. Accordingly, the interior of the housing may include features (e.g., bonding surfaces, alignment members, etc.) to help support and position the circuit on the substrate. As shown in FIG. 8B, the bottom surface of the housing includes one large aperture to expose a bottom conductor surface of a substrate. The connection of the housing to the heat sink additionally places the bottom conductor surface of the substrate in thermal contact with the heat sink.

The power module housing 500 may be fabricated from various pieces that are bonded or fastened together. Alternatively, the power module hosing may be fabricated from a single piece that is formed by machining or molding (e.g., injection molded). The housing may be constructed from an insulating material that can withstand the temperatures of a power system. In one possible implementation, the housing is polybutylene terephthalate (PBT). In another possible implementation, the housing is polyamide (PA).

The power module housing can include one or more (e.g., two) mounting flanges 820 that are each mechanically coupled to a side surface (e.g., opposite side surfaces) 810 of the housing 500. Each mounting flange 820 includes a fastener hole (i.e., hole) 830 for receiving a fastener (e.g., screw), which can be used to couple a bottom surface of each flange 820 to a top surface of the heat sink. Additionally, the flanges can include a flexible structure 840 to reduce a mechanical stress on a substrate within the housing caused by fastening the housing to the heat sink. The flexible structure includes a plurality of collinear slots (e.g., slots, slots aligned along a line 845) defined by the flange and the side surface 810 (i.e., side wall) of the housing. For example, the plurality of slots may include a central slot having two additional slots on either side of the central slot. The central slot may be larger than each of the two additional slots on either side. Additionally the two slots on either side of the central slot may be the same dimensions. In a possible implementation, the flanges may additionally include a cylinder shaped guiding member 850 to help position a fastener during assembly of the housing with the heat sink.

Figure 9A:
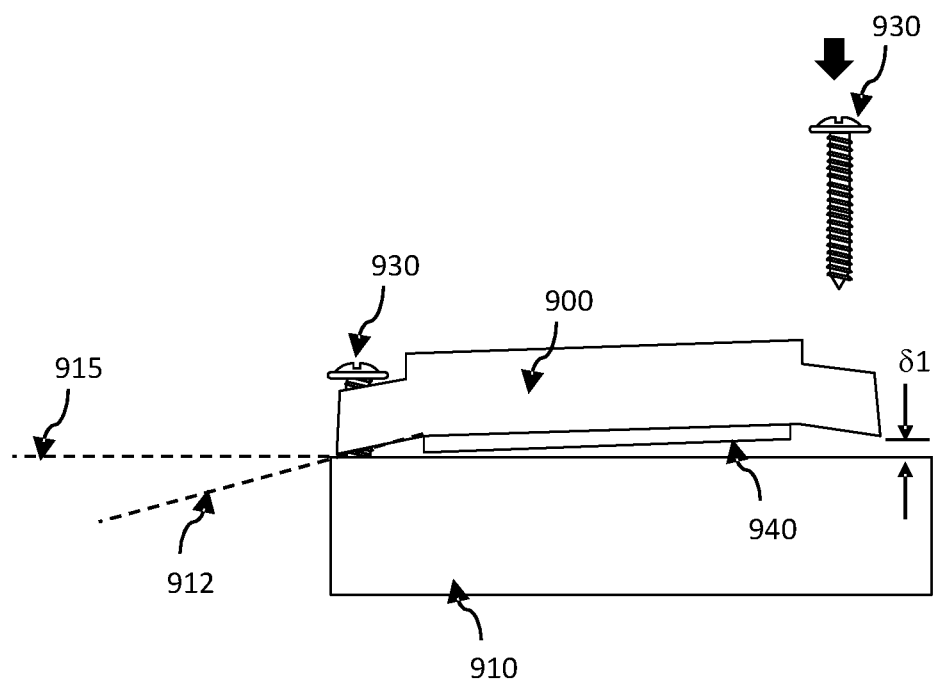
FIG. 9A is a side view of a power module housing having flanges with wedge surfaces.
Figure 9B:
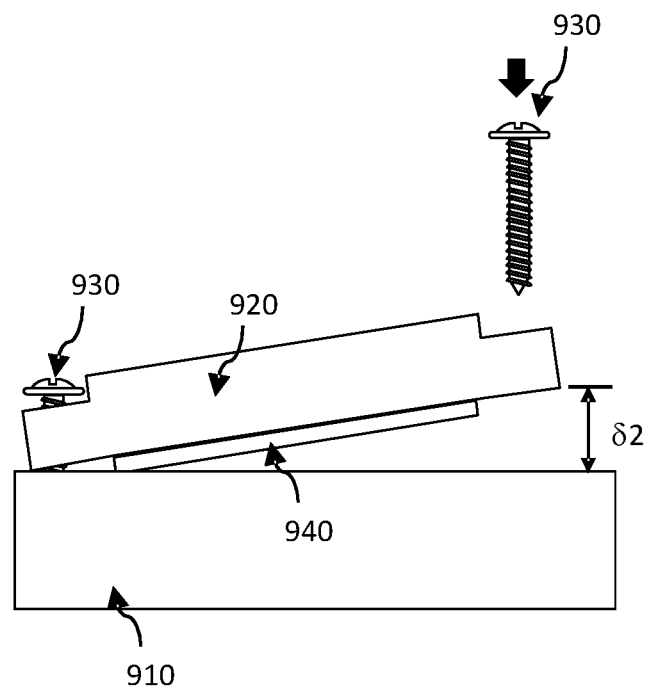
FIG. 9B is a side view of a power module housing having flanges with flat surfaces.

A bottom surface of the flange may form an angle with respect to a top surface of the heat sink or the housing. In other words, a surface of flange may be aligned along a plane 912 non-parallel to a plane 915 along which the top surface of the heat sink is aligned. Additionally, or alternatively, a top surface of the flange may form an angle with the top surface of the heat sink. The angled bottom or top surface may be referred to as a wedge surface. FIG. 9A illustrates fastening a housing 900 (i.e., case) having wedge surfaces to a heat sink 910, while FIG. 9B illustrates fastening a housing 920 to a heat sink 910 with a flange having flat surfaces (i.e., not having wedge surfaces). As shown in FIG. 9A and FIG. 9B, when a flange is fastened (i.e., bolted) to the heat sink 910 using a fastener 930 (i.e., screw), a torque is produce at a contact point between the substrate (i.e., the bottom conductor of the substrate) 940 and the heat sink. This torque causes a displacement ($\delta 1$, $\delta 2$), which can be used to visualize the stress placed on the housing. A larger displacement corresponds to more stress placed on the housing 900 when fastened to the heat sink 910. As shown in FIG. 9A and FIG. 9B, the magnitude of the displacement produced by a wedge surface flange is less than that produced by a flat surface flange (i.e., $\delta 1 < \delta 2$). Thus, the stress on the housing (e.g., caused by a force/torque produced during coupling by a fastener) is reduced by wedge surfaces and a flexible structure of the flanges.

Figure 10:
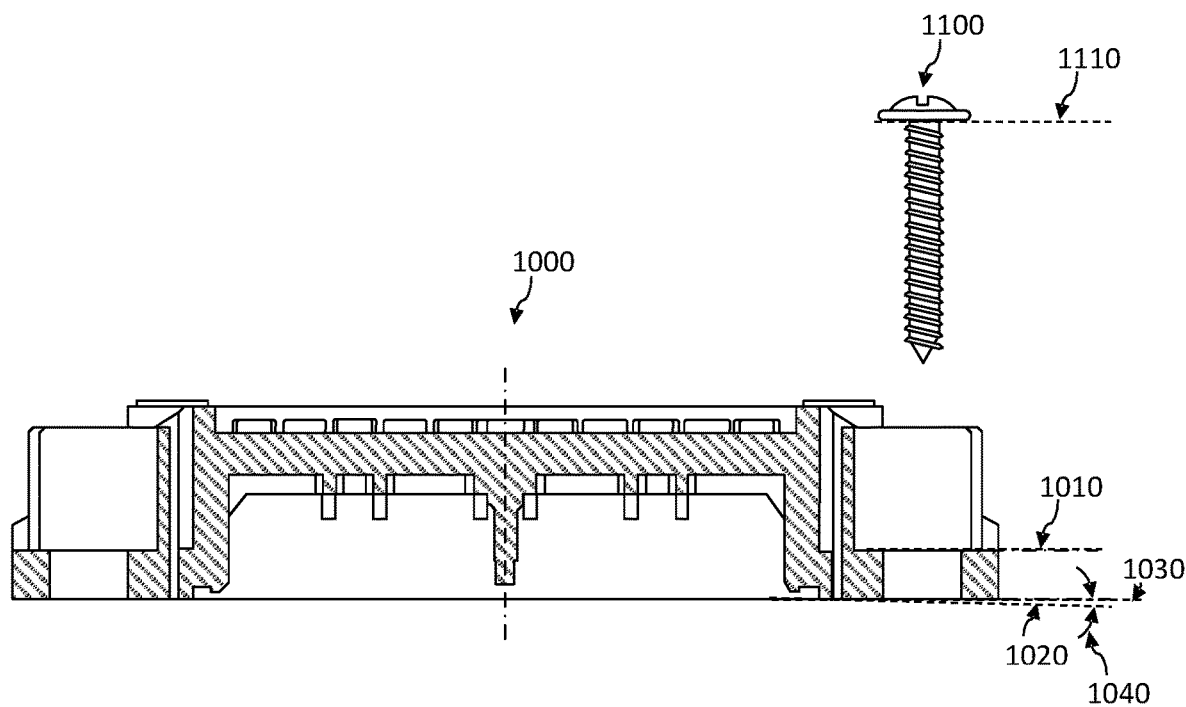
FIG. 10 is a side view cross section of a housing including a flange with a wedge bottom surface.

FIG. 10 is a side-view of a cross-section of a housing 1000 that includes a flange having a wedged bottom surface. As shown, the flange has a top surface 1010 configured (flat) so that a surface 1110 of a fastener 1100 can seat flush with the top surface 1010. The flange has a bottom surface 1020 that forms an angle 1040 with a plane 1030 that is parallel to the top surface 1010. In a possible implementation, the angle 1040 is less than 5 degrees (e.g., 1 degree). The force applied by a fastener 1100 may be distributed and/or redirected by the wedge (i.e., sloped, angled) surface (or surfaces) of the flange. The distributed and/or redirected force may be (at least) partially absorbed by a displacement in the flexible structure. Accordingly, stress on the housing 1000 may be reduced or eliminated. This stress reduction or elimination may prevent cracking and/or breaking of a substrate affixed to the housing because a stress reduction on the housing can correspond to a stress reduction on the affixed substrate.

The disclosed housing (i.e., enclosure, case, etc.) can be used with variety of power systems. For example, the housing may be part of a power integrated module (PIM). The PIM may operate in electrical ranges up to hundreds of amperes and up to 1200 volt devices. The PIM may be configured for a variety of purposes, including but not limited to switching, rectification, inverting, power factor correction, and may be used in a variety of applications, including but not limited to motors, power supplies, and renewable energy systems.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation. As used in the specification, and in the appended claims, the singular forms "a," "an," "the" include plural referents unless the context clearly dictates otherwise. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A power module housing comprising:
    a top surface having a plurality of apertures, each within a raised area above the top surface and each aperture configured to receive a press-fit pin;
    a side surface; and
    a flange that is contiguous with the side surface, the flange having an opening for receiving a fastener, and a flexible structure that includes at least one slot, the at least one slot being disposed between the opening in the flange and the plurality of apertures.

2. The power module housing according to claim 1, wherein the flange includes a wedge surface, the wedge surface and the flexible structure reduce a stress on the power module housing when the fastener is used to mount the power module housing to a surface.

3. The power module housing according to claim 1, wherein the side surface is a first side surface, the flange is a first flange, the opening is a first opening, the fastener is a first fastener, the first flange includes a first wedge surface, and the flexible structure is a first flexible structure, the power module housing further comprising:
    a second side surface; and
    a second flange that is contiguous to a second side surface, the second flange having a second opening for receiving a second fastener, a second wedge surface, and a second flexible structure that includes the at least one slot, the second wedge surface and the second flexible structure reducing a stress on the power module housing, when the second fastener is used to mount the power module housing to a surface.

4. The power module housing according to claim 3, further comprising:
    a third side surface contiguous to the top surface, the first side surface, and the second side surface;
    a fourth side surface contiguous to the top surface, the first side surface, and the second side surface; and
    the first side surface, the second side surface, the third side surface, the fourth side surface, and the top surface defining an interior of the power module housing that is configured to receive a circuit on a substrate.

5. The power module housing according to claim 4, wherein the circuit on the substrate includes press-fit pins that extend from a top surface of the circuit on the substrate through the plurality of apertures when the circuit on the substrate when received by the power module housing.

6. The power module housing according to claim 4, wherein the substrate is a direct bonded copper (DBC) substrate.

7. The power module housing according to claim 1, wherein the raised area above the top surface extends a creepage length for the power module housing by a length that is proportional to a height of the raised area above the top surface.

8. The power module housing according to claim 1, wherein each of the plurality of apertures is a slot in a first direction or a slot in a second direction.

9. The power module housing according to claim 8, wherein the plurality of apertures are arranged so that slots in the first direction are adjacent to slots in the second direction and vice versa.

10. The power module housing according to claim 8, wherein the first direction and the second direction are orthogonal.

11. The power module housing according to claim 1, wherein each of the plurality of apertures is a cross-shaped aperture.

12. The power module housing according to claim 11, wherein each of the cross-shaped apertures have the same orientation.

13. The power module housing according to claim 1, wherein the power module housing is injection molded.

14. The power module housing according to claim 13, wherein the power module housing is polybutylene terephthalate (PBT) or Polyamide (PA).

15. A power module comprising:
    a housing having a plurality of apertures in a top surface of the housing and a pair of mounting flanges at opposite sides of the housing, each mounting flange including a flexible structure including at least one slot disposed between an opening in the mounting flange and the plurality of apertures;
    a plurality of press-fit pins that extend through the plurality of apertures and that are mechanically and electrically configured to be coupled to a plurality of vias, each aperture corresponding to a protrusion that extends above the top surface of the housing; and
    fasteners configured to couple the pair of mounting flanges to a heat sink, the flexible structure of each mounting flange reducing stress on the housing caused by the coupling.

16. The power module according to claim 15, wherein the plurality of press-fit pins are oriented in a first direction and a second direction, the first direction orthogonal to the second direction.

17. The power module according to claim 16, wherein the plurality of apertures include slots in the first direction and slots in the second direction.

18. The power module according to claim 16, wherein the plurality of apertures are cross-shaped apertures, each cross-shaped aperture capable of receiving a press-fit pin oriented in the first direction or a press-fit pin oriented in the second direction.

19. The power module according to claim 15, wherein the flexible structure is a plurality of collinear slots in a side wall of the housing.

20. The power module according to claim 15, wherein the power module is included in a system including:
    a printed circuit board (PCB); and
    a heat sink, the power module being disposed between the printed circuit board and the heat sink.

21. A housing comprising:
    a plurality of apertures through a top surface, each aperture configured to receive a press-fit pin having a rectangular cross-section that is oriented in one of two possible directions, each aperture centered within a protrusion that extends a height about the top surface; and a pair of mounting flanges at opposite sides of the housing, at least one mounting flange having a wedge surface including at least one slot in a flexible structure, the wedge surface and the flexible structure of the at least one mounting flange configured to reduce a stress exerted on the mounting flange.

22. The housing according to claim 21, wherein each protrusion increases a creepage length for the housing.

23. The power module housing according to claim 1, wherein the flange has a bottom surface that is non-parallel to a plane along which the top surface of the housing is aligned.

* * * * *